(12) United States Patent
Lahiri et al.

(10) Patent No.: US 11,394,393 B1
(45) Date of Patent: Jul. 19, 2022

(54) RF DAC WITH IMPROVED HD2 AND CROSS-TALK PERFORMANCE BY SHADOW SWITCHING IN BLEEDER PATH

(71) Applicant: XILINX, INC., San Jose, CA (US)

(72) Inventors: Abhirup Lahiri, Dublin (IE); Roberto Pelliconi, Imola (IT)

(73) Assignee: XILINX, INC., San Jose, CA (US)

( * ) Notice: Subject to any disclaimer, the term of this patent is extended or adjusted under 35 U.S.C. 154(b) by 125 days.

(21) Appl. No.: 17/029,918

(22) Filed: Sep. 23, 2020

(51) Int. Cl.
| | |
|---|---|
| H03M 1/66 | (2006.01) |
| H04B 1/00 | (2006.01) |
| H03M 1/36 | (2006.01) |
| H02M 3/156 | (2006.01) |

(52) U.S. Cl.
CPC ........... H03M 1/661 (2013.01); H02M 3/156 (2013.01); H03M 1/362 (2013.01); H04B 1/0007 (2013.01)

(58) Field of Classification Search
CPC ...... H03M 1/661; H03M 1/362; H02M 3/156; H04B 1/0007
USPC .......................................................... 341/144
See application file for complete search history.

(56) References Cited

U.S. PATENT DOCUMENTS

| | | | | |
|---|---|---|---|---|
| 9,917,513 | B1 | 3/2018 | Le et al. | |
| 9,941,885 | B2 * | 4/2018 | Singh | H03K 3/356104 |
| 10,148,277 | B1 * | 12/2018 | Singh | H03M 1/0863 |
| 10,367,505 | B2 * | 7/2019 | Singh | H03K 19/0013 |
| 10,944,417 | B1 * | 3/2021 | Lahiri | H03M 1/742 |
| 2008/0252633 | A1 * | 10/2008 | Kim | H03K 19/0185 345/76 |
| 2011/0043265 | A1 * | 2/2011 | Jain | H03K 3/3565 327/206 |
| 2018/0069552 | A1 * | 3/2018 | Singh | H03K 19/0013 |
| 2018/0191348 | A1 * | 7/2018 | Singh | H03K 19/018521 |
| 2018/0337685 | A1 * | 11/2018 | Singh | H03M 1/0872 |
| 2020/0220528 | A1 | 7/2020 | Koh et al. | |
| 2020/0404752 | A1 * | 12/2020 | Lou | H03M 1/68 |

OTHER PUBLICATIONS

Li, Fanlong, "The Impact of a Balun on the Second Harmonic of an RF DAC," Analog Design Journal, Texas Instruments, ADJ 1Q 2019, 6 pages.
"Understanding Key Parameters for RF-Sampling Data Converters," White Paper: Zynq UltraScale + RFSoCs, WP509(v1.0) Feb. 20, 2019, 20 pages.

* cited by examiner

*Primary Examiner* — Jean B Jeanglaude
(74) *Attorney, Agent, or Firm* — Patterson + Sheridan, LLP (57) ABSTRACT

A DAC cell includes first and second transistors, drain-source coupled at a first node, a gate of the second transistor coupled to a data input (D), and third and fourth transistors, drain-source coupled at a second node, a gate of the fourth transistor coupled to a complement of the data input (DB). The circuit further includes first and second shadow transistors each coupled between the first node and ground, a gate of the first shadow transistor coupled to a switching input (S) and a gate of the second shadow transistor coupled to a complement of the switching input (SB). The circuit still further includes third and fourth shadow transistors each coupled between the second node and ground, a gate of the third shadow transistor coupled to S and a gate of the fourth shadow transistor coupled to SB.

20 Claims, 10 Drawing Sheets

```
┌─────────────────────────────────────────┐
│ Provide a first transistor and a second │
│ transistor, a drain of the first        │
│ transistor coupled to a first output, a │
│ source of the first transistor coupled  │── 510
│ to a drain of the second transistor at  │
│ a first node, and a gate of the         │
│ second transistor coupled to a data     │
│ input                                   │
└─────────────────────────────────────────┘
                    ↓
┌─────────────────────────────────────────┐
│ Provide a third transistor and a fourth │
│ transistor, a drain of the third        │
│ transistor coupled to a second          │
│ output, a source of the third           │── 520
│ transistor coupled to a drain of the    │
│ fourth transistor at a second node,     │
│ and a gate of the fourth transistor     │
│ coupled to a complement of the data     │
│ input                                   │
└─────────────────────────────────────────┘
                    ↓
┌─────────────────────────────────────────┐
│ Provide first and second shadow         │
│ switching transistors, whose drains     │
│ are each coupled to the first node,     │
│ and whose sources are each coupled      │
│ to ground, a gate of the first shadow   │── 530
│ transistor coupled to a switching       │
│ input (S) and a gate of the second      │
│ shadow transistor coupled to a          │
│ complement of the switching input (SB)  │
└─────────────────────────────────────────┘
                    ↓
┌─────────────────────────────────────────┐
│ Provide third and fourth shadow         │
│ switching transistors, whose drains     │
│ are each coupled to the second node,    │
│ and whose sources are each coupled to   │── 540
│ ground, a gate of the third shadow      │
│ transistor coupled to S and a gate of   │
│ the fourth shadow transistor coupled    │
│ to SB.                                  │
└─────────────────────────────────────────┘
```

```
┌─────────────────────────────────────────────┐
│ receiving a digital data signal ("D") at a  │
│ gate of a first transistor of a source      │
│ coupled pair of a DAC, and a complement     │
│ of the data signal ("DB") at a gate of a    │──── 610
│ second transistor of the pair, the sources  │
│ further coupled to ground, the drains       │
│ respectively coupled to a first output and  │
│ a second output                             │
└─────────────────────────────────────────────┘
                       ↓
┌─────────────────────────────────────────────┐
│ applying a first switching input (S) to a   │
│ gate of a first shadow transistor, and a    │
│ complement of the switching input (SB) to   │
│ a gate of a second shadow transistor,       │
│ wherein drains of each of the first and     │
│ second shadow transistors are coupled       │──── 620
│ together and to sources of the first and    │
│ second shadow transistors, and are further  │
│ coupled to a transistor of a bleeder        │
│ current source provided between a drain of  │
│ the first transistor and ground             │
└─────────────────────────────────────────────┘
                       ↓
┌─────────────────────────────────────────────┐
│ applying S to a gate of a third shadow      │
│ transistor, and SB to a gate of a fourth    │
│ shadow transistor, wherein drains of each   │
│ of the third and fourth shadow              │
│ transistors are coupled together and to     │──── 630
│ sources of the third and fourth shadow      │
│ transistors, and are further coupled to a   │
│ transistor of a bleeder current source      │
│ provided between a drain of the second      │
│ transistor and ground                       │
└─────────────────────────────────────────────┘
                       ↓
┌─────────────────────────────────────────────┐
│ switching S and SB at a pre-defined clock   │
│ frequency of the DAC whenever the D and DB  │──── 640
│ signals are not toggled.                    │
└─────────────────────────────────────────────┘
```

RF DAC WITH IMPROVED HD2 AND CROSS-TALK PERFORMANCE BY SHADOW SWITCHING IN BLEEDER PATH

TECHNICAL FIELD

Embodiments of the present invention generally relate to digital to analog converters (DACs), and in particular to a radio frequency (RF) DAC that implements shadow capacitor switching.

BACKGROUND

Digital-to-analog conversion is the process of converting digital (binary) codes into a continuous range of analog signal levels. Digital codes can be converted into analog voltage, analog current, or analog charge signals using a digital-to-analog converter (DAC).

It is noted that in synthesizing a signal using a DAC, frequency planning can prove to be difficult due to a second order performance (HD2) spur folding back around an input frequency Fin. For example, a 3.4 GHz signal synthesis using a 10 GHz sampling DAC can fold the HD2 spur at around 3.2 GHz. This is because as a result of conversion, for a given synthesized signal F1, with a given sampling clock frequency Fclk, the following harmonic contents are theoretically generated (including distortion components): F1, 2*F1, 3*F1, etc., Fclk-F1, Fclk-2*F1, Fclk-3*F1, etc . . . , Fclk+F1, Fclk+2*F1, Fclk*3*F1, etc., and many other harmonics involving other multiples of Fclk. Thus, while the amplitude of the harmonic content may vary, each such harmonic is theoretically there. Thus, an HD2 of 3.2 GHz with F1=3.4 GHz and Fclk=10 GHz, is the result of 10 G-2*3.4 At higher frequencies, much of the this HD2 performance arises from common mode switching glitches from the current cell differential pair switching during current steering, and which can be seen in the differential spectrum due to non-zero mismatch, for example, a −30 dB of common mode rejection, of the output network.

Conventionally, there have been proposals to address this problem. For example, it has been proposed to reduce this glitch by modifying the switching cross-over point, so as to, for example, use a "make before a break" type of switching. However, such techniques are better suited for low frequency DACs. This is because using an extreme make-before-break technique causes some charge loss, which is directly proportional to the output frequency being synthesized. This charge loss is reflected into a performance degradation.

Therefore, a need exists for an improved DAC that reduces common mode switching glitches.

SUMMARY

Various DAC current steering cells are described herein. A method of operating a DAC current cell is also described herein. In one example, a DAC current steering circuit is provided. The circuit includes first and second transistors, a drain of the first transistor coupled to a first output, a source of the first transistor coupled to a drain of the second transistor at a first node, and a gate of the second transistor coupled to a data input (D), and third and fourth transistors, a drain of the third transistor coupled to a second output, a source of the third transistor coupled to a drain of the fourth transistor at a second node, and a gate of the fourth transistor coupled to a complement of the data input (DB). The circuit further includes first and second shadow transistors, whose drains are each coupled to the first node, and whose sources are each coupled to ground, a gate of the first shadow transistor coupled to a switching input (S) and a gate of the second shadow transistor coupled to a complement of the switching input (SB). The circuit still further includes third and fourth shadow transistors, whose drains are each coupled to the second node, and whose sources are each coupled to ground, a gate of the third shadow transistor coupled to S and a gate of the fourth shadow transistor coupled to SB.

In another example, a DAC current steering circuit is provided. The circuit includes a first transistor, a drain of the first transistor coupled to a first output node, a source of the first transistor coupled to a common node, and a gate of the first transistor coupled to a data input, and a second transistor, a drain of the second transistor coupled to a second output node, a source of the second transistor coupled to the common node, and a gate of the second transistor coupled to a complement of the data input. The circuit further includes a third transistor whose drain is coupled to the first output node, and whose source is coupled to ground, and a fourth transistor whose drain is coupled to the second output node, and whose source is coupled to ground. The circuit still further includes first and second shadow transistors, whose drains and sources are each coupled to the source of the third transistor, a gate of the first shadow transistor coupled to a switching input (S) and a gate of the second shadow transistor coupled to a complement of the switching input (SB), and third and fourth shadow transistors, whose drains and sources are each coupled to the source of the fourth transistor, a gate of the third shadow transistor coupled to S and a gate of the fourth shadow transistor coupled to SB.

In yet another example, a DAC current steering circuit is provided. The circuit includes a first transistor, a drain of the first transistor coupled to a first output, a source of the first transistor coupled to a drain of a second transistor at a first node, and a gate of the second transistor coupled to a data input signal, and third and fourth transistors, a drain of the third transistor coupled to a second output, a source of the third transistor coupled to a drain of the fourth transistor at a second node, and a gate of the fourth transistor coupled to a data input complement signal, the sources of each of the third and fourth transistors connected at a third node, the third node coupled to a main current source. The circuit further includes first and second compensation capacitance supplies respectively coupled to the first and second nodes, the first compensation capacitance supply controlled by an inverse of the data input signal, and the second compensation capacitance supply controlled by an inverse of the data input complement signal.

In some examples, the data input and data input complement signals are switched in an asymmetric manner.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Figure 7:
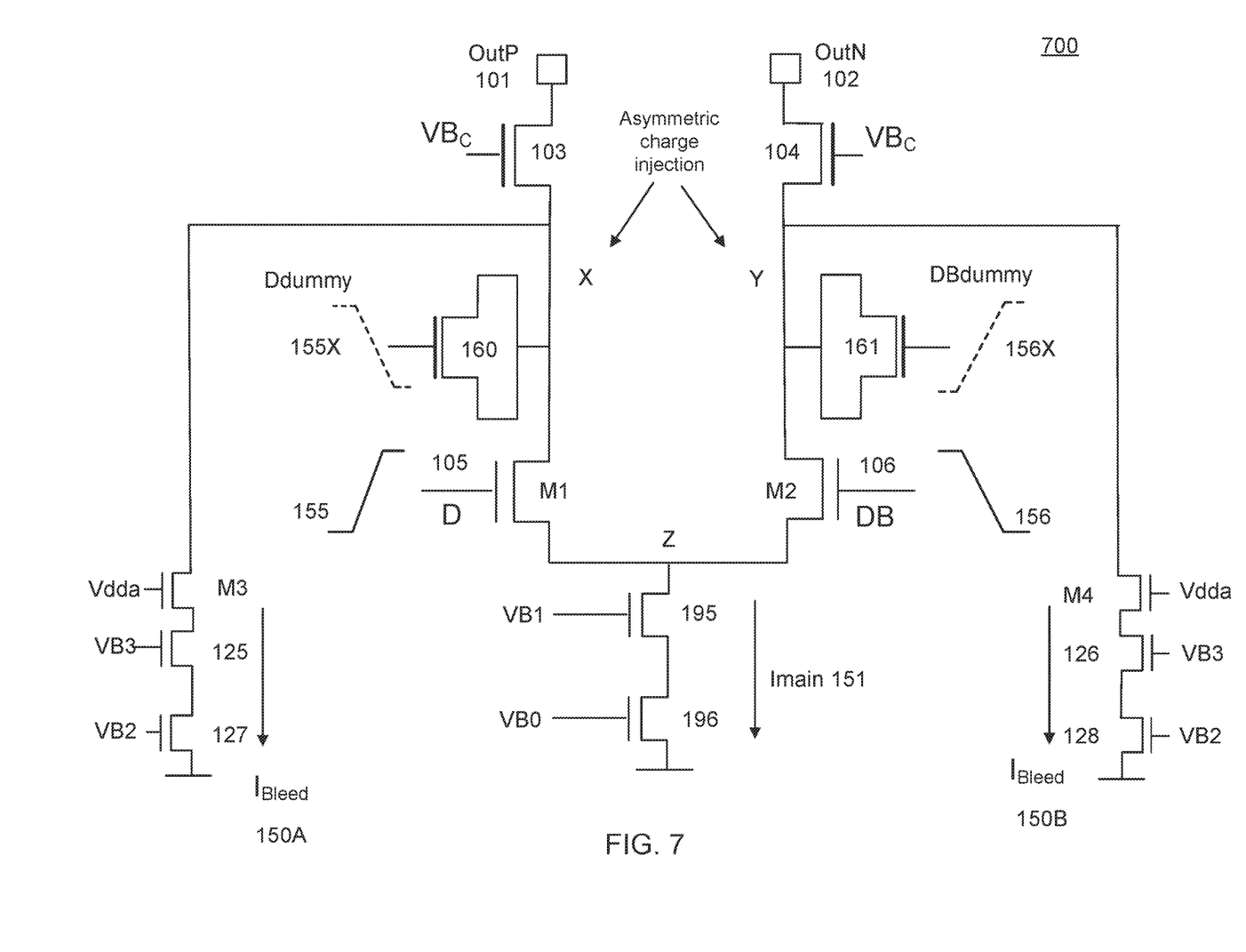
FIG. 7 depicts another alternate current steering DAC current cell with compensation capacitance supply devices, according to an example.
Figure 8:
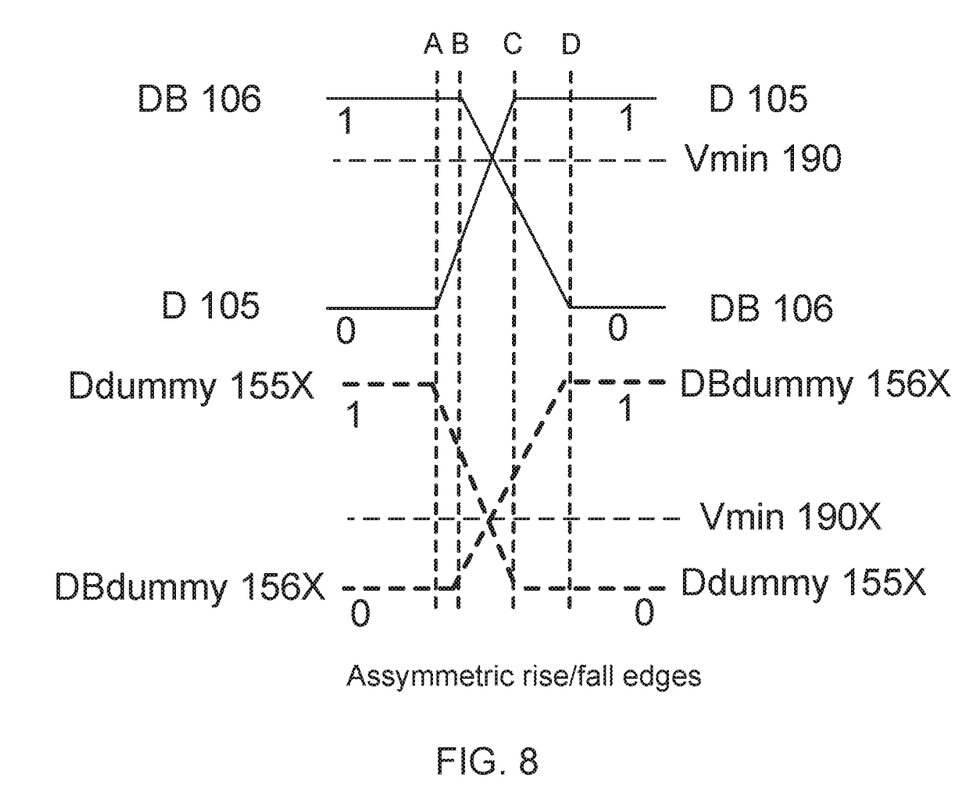
FIG. 8 illustrates signal switching with asymmetric rise and fall edges of both a data signal D and its mirror image Ddummy, and a data complement signal, DB and its mirror image DBdummy, according to an example.
Figure 9:
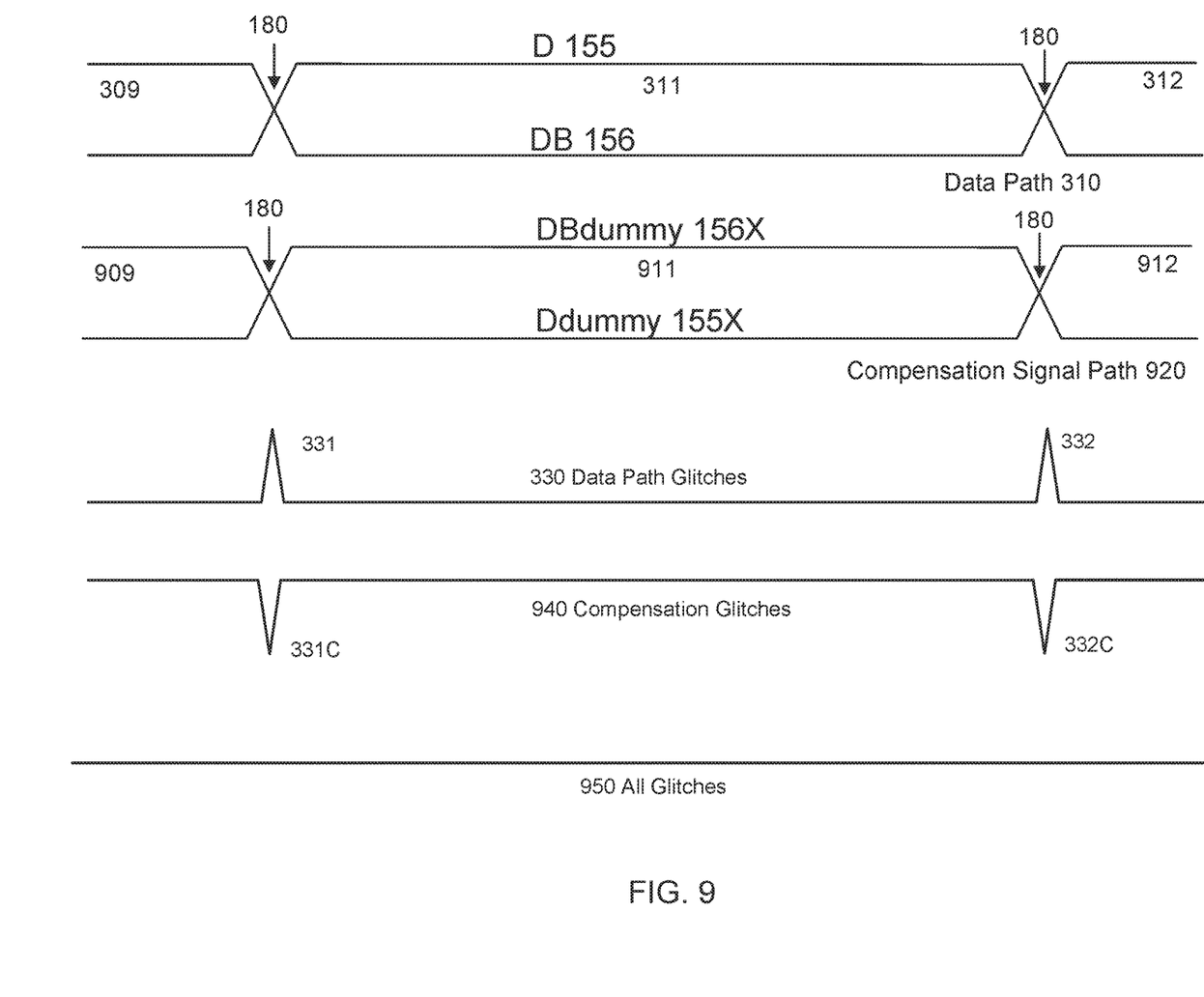
FIG. 9 illustrates the effects of glitch energy added by the compensation capacitance supply devices, according to an example.

Various circuits are described below that improve HD2 and cross-talk performance of RF DACs. In one or more examples undesired glitch energy introduced by charge injections created when the D and DB signals toggle in a DAC may be either canceled or augmented. If canceled, the effect of the undesired charge injections at respective nodes coupled to each output of the DAC is compensated for by introducing an opposite charge injection at each such node. This approach is illustrated in FIGS. 7-9 described below. On the other hand, if the glitch energy is augmented, additional glitch energy is introduced to the outputs of the circuit, at a period that facilitates it easily being filtered out. This approach is illustrated in FIGS. 2-6 described below.

In one or more examples of the second, or glitch energy augmentation approach, instead of reducing or canceling glitch energy generated by switching in the main data path, parallel paths are provided through which switching energy may be added to the main path. In one or more examples, the additional shadow switching energy is added through the use of (already available) bleeder current paths in the DAC cell. These bleeder current paths provide a constant static current to improve HD3 performance. In one or more examples, such additional switching energy is provided in the bleeder current paths by using shadow signals. The shadow signals are switched at a multiple of the toggling frequency of the main data signals, but are only switched when the main data signals are not switching, such that a combination of the two sources of glitches results in a regular glitch at the multiple of the main data toggling frequency. In this manner, in one or more examples, existing bleeder current paths are re-used to provide the added shadow switching energy, thereby obviating any need to add complicated circuitry to a compact DAC cell.

Various DAC cells according to one or more examples also provide superior spurious performance when there is mismatch between switching devices.

Figure 1A:
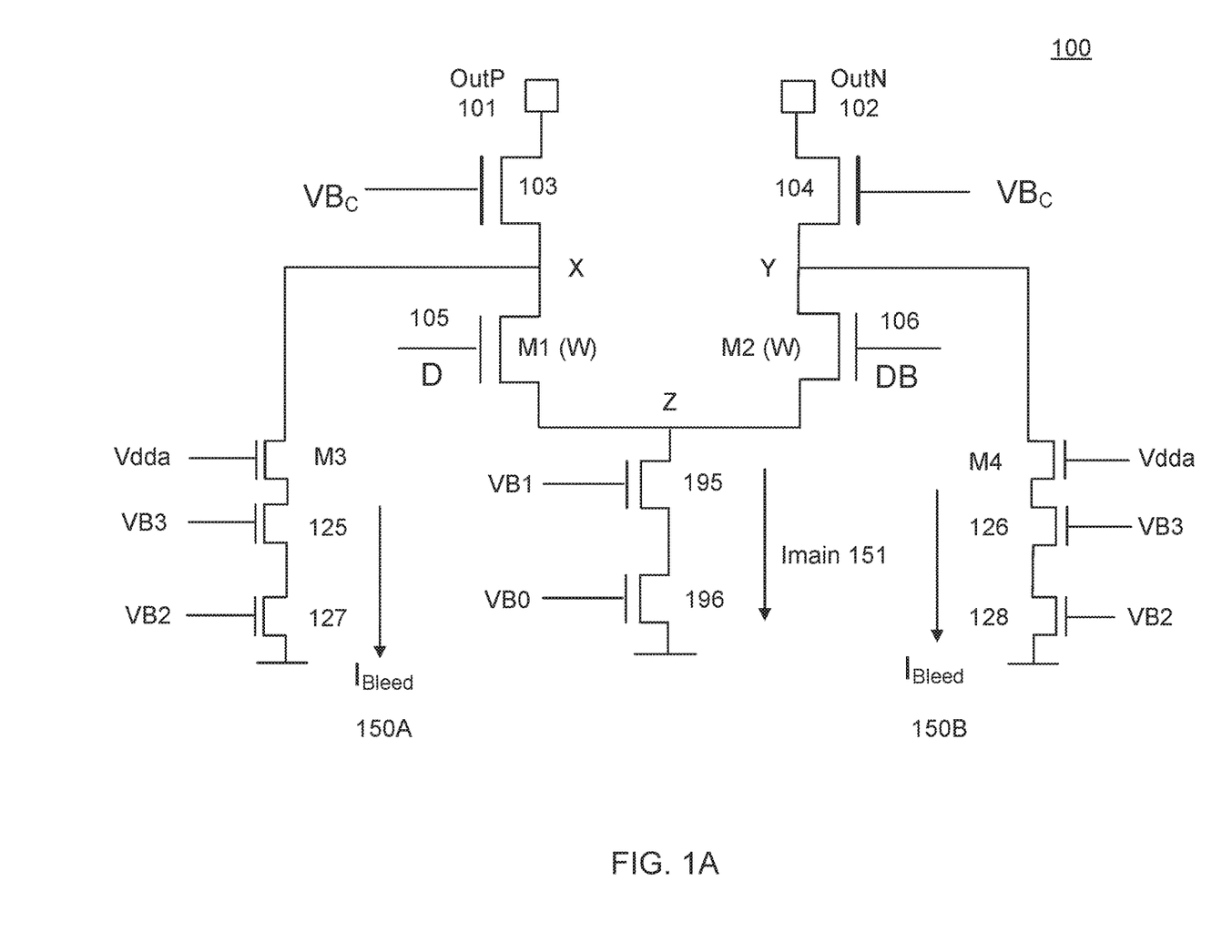
FIG. 1A is a conventional current steering DAC current cell provided with bleed source currents to improve linearity.

Turning now to FIG. 1A, a conventional current steering DAC cell with added bleeder current sources is illustrated. As noted above, the addition of bleed currents is a conventional approach that seeks to improve the linearity of the DAC. With reference to FIG. 1A, it is noted that its features are common to each of the examples illustrated in FIGS. 2 and 4, and it is thus convenient to describe them once, at the outset of this disclosure, with reference to FIG. 1A. Then, the description of the subsequent figures may focus on the additions and modifications to the basic DAC cell, as are respectively illustrated in each of the examples of FIGS. 2 and 4. In some examples, the conventional current steering DAC cell of FIG. 1A may be one cell out of, for example, 1024 equally sized cells provided in parallel, for a 1024 bit DAC. The DAC cells are collectively used to convert a set of digital inputs into an output analog signal waveform.

Continuing with reference to FIG. 1A, there is shown a differential amplifier 100 that includes two stacks of cascoded transistors. One stack is on the left, including transistors 103 and M1, and connected to a first output, OutP 101, and another stack is shown on the right of the figure, including transistors 104 and M2, and is connected to a second output, OutN 102. M1 and M2 are generally identical transistors, as are transistors 103 and 104. As shown, the upper transistors 103 and 104 have an identical voltage VB3 supplied to each of their gates, which keeps them both on. In some examples, VB3 may be equal to or close to an upper voltage $V_{DD}$ that is supplied to the differential amplifier. The lower tier of transistors, namely M1 and M2, have gates that are supplied with data signal D 105 and its complement DB 106, respectively. The lower set of transistors M1 and M2 are source connected at node Z. Current steering DAC cell 100 steers the current to one of the two outputs OutN 102 or OutP 101 by the gate voltage that is applied to the lower transistors M1 and M2. Thus, when D is high, or a logical "1", then M1 is on, and M2 is off, and the current is steered through OutP 101. Conversely, when D is low, and thus a logical "0", then its complement DB is a logical "1" and transistor M1 is off, and transistor M2 is on. As a result, in this case the current is steered through OutN 101. In one or more examples, the signals D and DB are supplied to the DAC cell by digital circuitry to which a plurality of DAC current steering cells 100 are coupled. In general, DAC cell 100 has its own driver circuit, which may be, for example a CMOS driver, essentially a CMOS inverter. This allows each DAC cell in a plurality of DAC cells to be independently controlled, so that any shape of waveform, with essentially any set of frequency components, may be output by the DAC.

Another parameter of the DAC cell is the frequency at which D and DB are toggled. Thus, not only is current steered right of left by DAC cell 100 as a function of the logical values of D and DB, but it is done so at a certain desired frequency. For example, if a 3.5 GHz signal is desired to be output by DAC cell 100, then D and DB may toggle 2*3.5 billion times per second. As described in greater detail below, each time these D and DB signals toggle, unless the load on each of OutP 101 and OutN 102 is perfectly matched, a glitch is generated.

Continuing with reference to FIG. 1A, at the bottom of the differential amplifier there is a current source element, made of cascoded transistors 195 and 196, whose gates are supplied with VB1 and VB0, respectively, such as, for example, by current mirrors. These voltages VB1 and VB0, a function of the currents being mirrored, determine the overall current Imain 151 through the differential amplifier of DAC cell 100. It is noted that there could be, in alternate examples, a single transistor instead of the two transistors shown. Thus, in the example of FIG. 1A, transistor 195's function is to improve the accuracy.

Although not shown in FIG. 1A, at each output there is a resistive load connected between a supply voltage $V_{DD}$ and the respective output. The resistances connected to OutP 101 and to OutN 102 are generally fixed resistors. An analog voltage is thus developed across each respective resistive load by steering the current left or right, in FIG. 1. For example, when the current is steered to OutP 101, then the voltage at OutP 101, which is VoutP=$V_{DD}$–Imain*R, where R is the fixed resistance connected at OutP, and the voltage at OutN 102 remains at $V_{DD}$, as there is no current flowing through the fixed resistance to which OutN is coupled. The differential voltage between OutP and OutN, {OutP−OutN} is thus ($V_{DD}$–Imain*R)−Vdd=−Imain*R. So, depending upon how the current is steered, OutP and OutN are either high or low. Thus, when the current is steered to OutN 102, then the voltage at OutN 102, which is VoutN=$V_{DD}$−Imain*R, where R is the fixed resistance connected at OutN, and the voltage at OutP 101 remains at $V_{DD}$, as there is no current flowing through the fixed resistance to which OutP is coupled. The differential voltage between OutP and OutN, {OutP−OutN} is thus $V_{DD}$−($V_{DD}$−(main*R)=+Imain*R. So the differential voltage of the DAC cell fluctuates between −Imain*R and +Imain*R. Each DAC cell connected on the left contributes a 1 Imain*R drop to the voltage on OutP 101, and similarly, each DAC cell connected on the right contributes a 1 Imain*R drop on OutN 102.

Because the voltage on each of OutP and OutN shifts from Vdd to Vdd-Imain*R every time D switches from "0" to "1", or DB switches from "0" to "1", as the case may be, there is a hard switch due to the switching on and off of M1 and M2. Adding bleed currents 150A and 150B ameliorates this hard switching to some extent, as follows. Because there is still some current running through transistor 103, as it is on, due to the fixed gate voltage $VB_C$ supplied to it, even when transistor M1 is off, and similarly, when transistor M2 is off, due to DB being low, there is still some current running through transistor 104, as it is on, due to the fixed gate voltage $VB_C$ supplied to it. Thus, by adding the bleed currents 150A and 150B, respectively, the cascode transistors 103 and 104 each appear "quasi-on" from the point of view of the output impedance, even when their controlling transistor, namely M1 or M2, respectively, is actually turned off. This is because the bleeder current pulls some current off through 103 or 104 even when M1 or M2, as the case may be, is off. Bleeder currents 150A and 150B may be generated, for example, using current mirrors or other current source elements. In some examples the bleed currents 150A, 150B are one-half that of Imain 151. In general bleed currents are static, and provide a constant DC current.

Thus, the bleeder currents provide a "soft-on" state for upper tier transistors 103 or 104, respectively, when M1 or M2 are off, making these upper tier transistors appear to not be fully off. In one or more examples, the bleeder current pathways, essentially found in every DAC current cell, may be leveraged to address the glitch energy generated by the toggling of the D and DB signals at a chosen output frequency. In the example of FIG. 1A, each of the bleeder currents is generated by a stack of three transistors. Thus, on the left side of the circuit, by M3, 125 and 127, and on the right side of the circuit, by transistors M4, 126 and 128.

Transistors M3 and M4 are driven by a voltage Vdda, and as shown, each of transistors 125 and 126 are driven by a voltage VB3, and each of transistors 127 and 128 are driven by a voltage VB2. It is noted that the function of transistors M3 and M4 is to mimic the stack of M1 and M2, so that the transistor stack of, for example, M3, 125 and 127 is similar to the stack of M1, 195 and 196. A similar symmetry is on the right side of the figure, where the transistor stack M4, 126 and 128 mimics the stack M2, 195 and 196. Additionally, M3 and M4 function as cascodes to isolate the bottom devices 125, 127 on the left form any glitches on node X, and bottom devices 126, 128 on the right form any glitches on node Y. This improves performance.

Accordingly, in one or more examples the glitch energy effect is minimized using a set of additional shadow transistor pairs that are either respectively inserted in each bleeder current path, in what is known as "Bleeder Gate Switching (BGS)", or are respectively coupled to each bleeder current path, in what is known as "Bleeder Source Switching (BSS)." In each of the additional shadow transistor pairs, one transistor's gate is driven by a switching signal S and the other transistor's gate is driven by its complement, SB. In one or more examples, the shadow transistors are switched so that the combination of the S and SB switching, with the D and DB switching, is at a clock rate of the DAC or at a multiple of the clock rate of the DAC. Thus, when D and DB are in fact toggling, the S and SB signals are not toggled (switched). Various implementations of DAC current steering cells with added shadow switching transistors are described below with reference to FIGS. 2-4.

Figure 1B:
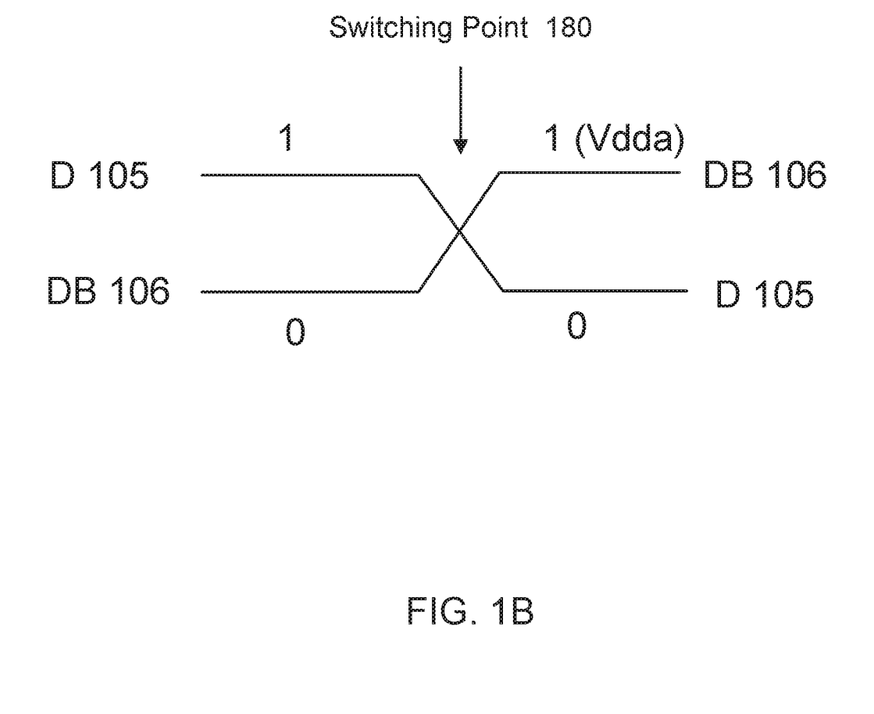
FIG. 1B illustrates an example of toggling the data and data complement input signals of FIG. 1A.
Figure 2:
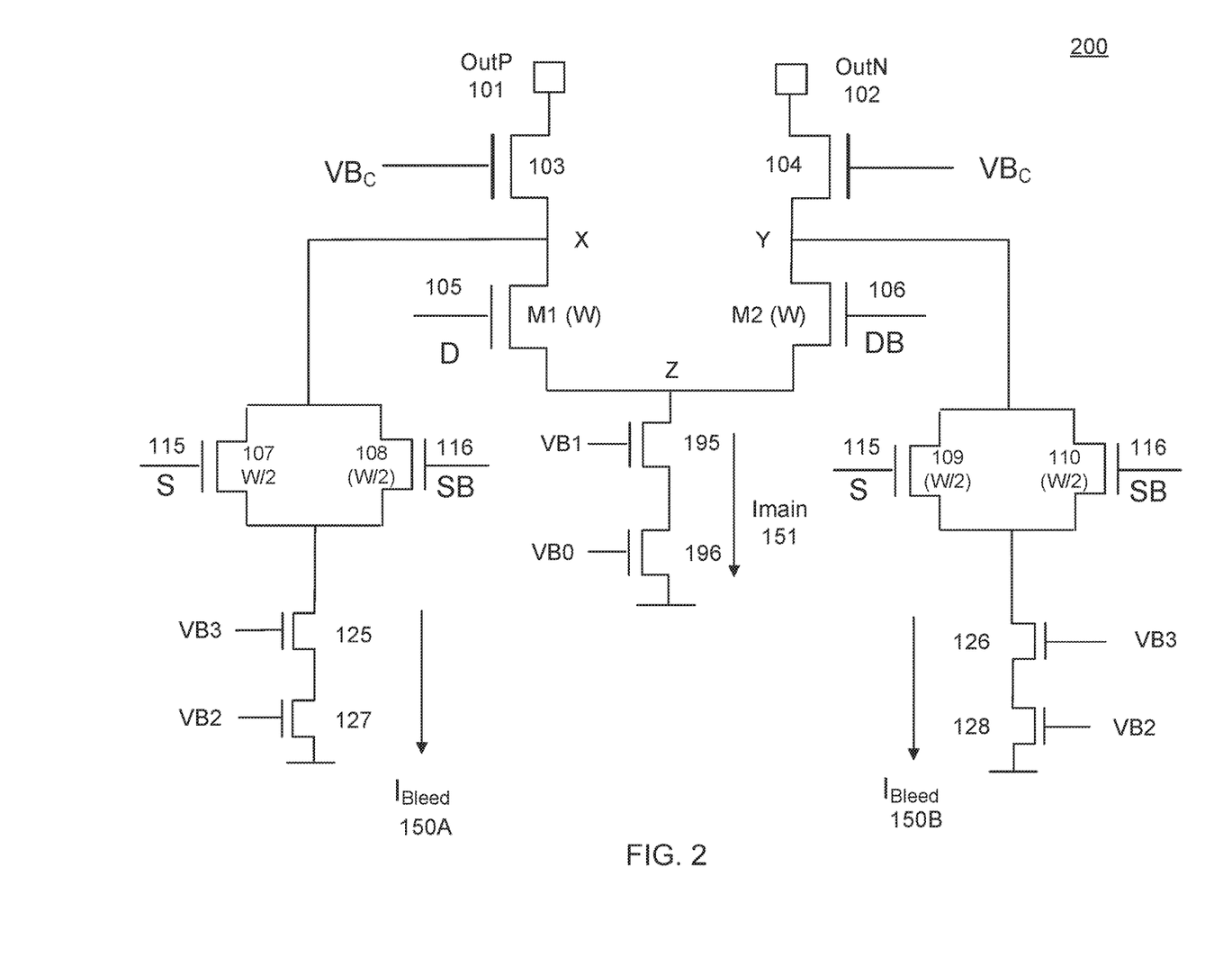
FIG. 2 is an example current steering DAC current cell with added switching in the bleeder current paths, according to an example.
Figure 4:
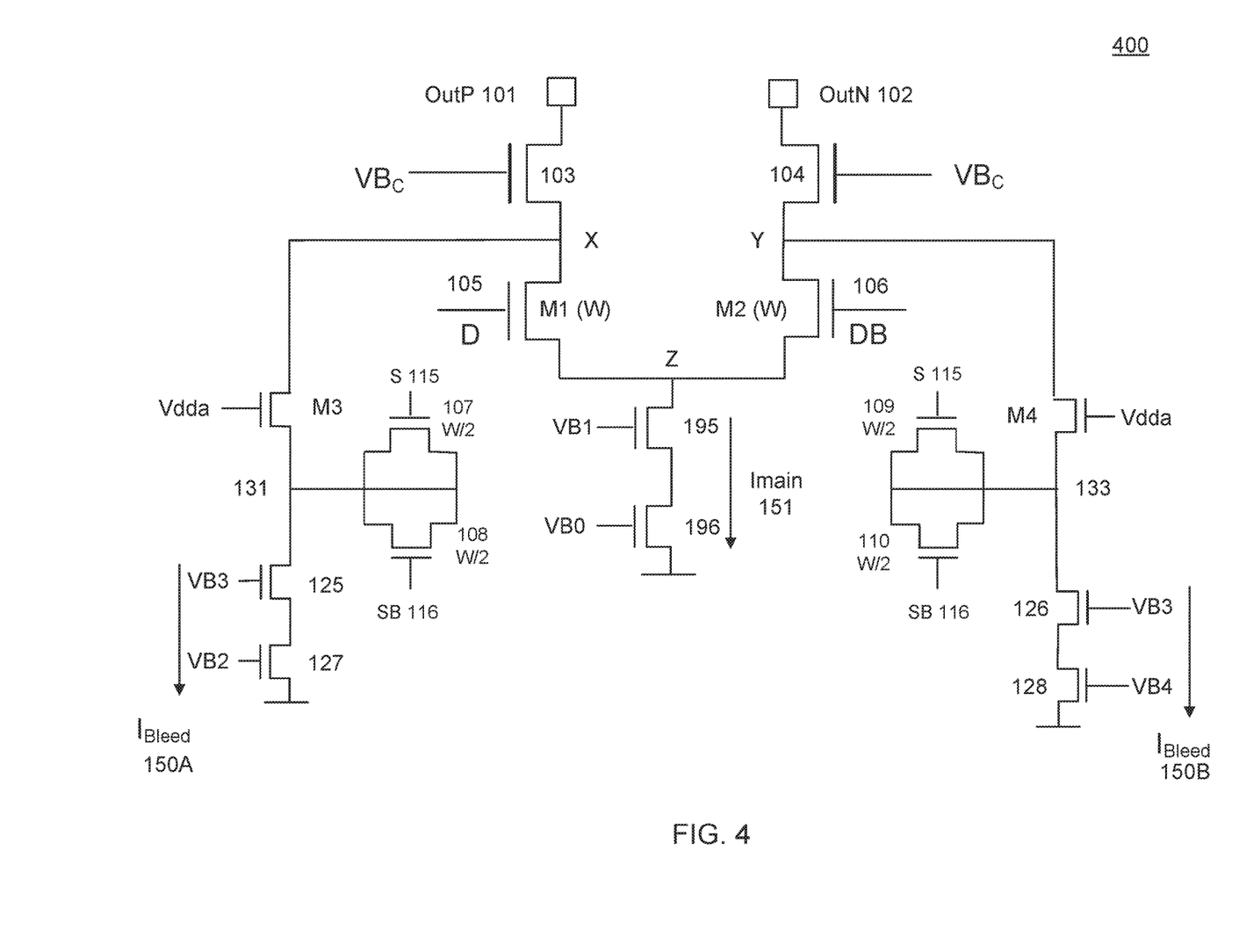
FIG. 4 is an alternate current steering DAC current cell with added switching in the bleeder current path, according to an example.

However, prior to describing the examples of each of FIGS. 2 and 4, the example of FIG. 1B is first described. FIG. 1B illustrates an example of toggling the data and data complement input signals of FIG. 1A. With reference to FIG. 1B, there are depicted the data signals D 105 and DB 106, before and after toggling to their next set of values, which occurs at switching point 180, as shown. In the depicted data path the D signal is initially a "1" and, after toggling, is a "0", and thus DB has the opposite values of D. Each signal is shown as having a high voltage value of Vdda, and a low value of ground. As described below, in one or more embodiments, Vdda, is also used as the high voltage for the switching signals used in the shadow switching transistors. Referring back to FIG. 1A, Vdda is also used to drive the gate of each of bleed current path transistors M3 and M4 to keep them in an "on" state. If D does not change during a clock period, then D and DB are not toggling. As described in detail below, it is precisely at such times of no change of D and DB that S and SB are switched.

Next described are two variations of shadow transistor switching, the BGS embodiment with reference to FIG. 2 and the BSS embodiment with reference to FIG. 4.

FIG. 2 is an example current steering DAC current cell, such as is shown in FIG. 1A, with added switching in the bleeder current paths, according to an example. The circuit of FIG. 2 implements a BGS embodiment. FIG. 2 is similar to the example DAC current cell shown in FIG. 1A, except for the addition of transistor pairs 107, 108, and 109, 110, respectively. Thus, with reference to FIG. 2, only the added shadow transistor pairs need be described. As shown, the two shadow transistor pairs are respectively coupled between nodes X and Y and the bleed current sources used to generate $I_{Bleed}$ 150A on the left of the figure, and $I_{Bleed}$ 150B on the right of the figure, respectively. In some embodiments, the transistors in the source coupled differential pair, namely M1 and M2 may have a width W, and each of the shadow switching transistors 107, 108, 109 and 110, may have a width that half of that, or W/2, as shown. In one or more examples, just as transistors M1 and M2 are identical, so are shadow switching transistors 107, 108, 109 and 110. In one or more examples, satisfying these two conditions is beneficial, because the switching energy from the bleeder current paths, and from the main data path, are proportional to their bias currents, HD2 performance is best when the switching energy from the bleeder paths are the same.

Continuing with reference to FIG. 2, it is noted that by comparison with the conventional circuit of FIG. 1A, on the left side of the circuit transistor M3 is replaced with shadow switching transistor pair 107 and 108, and on the right side of the circuit, transistor M4 is replaced with shadow switching transistor pair 109 and 110. It is further noted that this substitution does not change the static currents $I_{Bleed}$ 150A and $I_{Bleed}$ 150B, it simply routes the respective bleed currents through one or the other of the shadow switching transistors of the respective pairs, in response to the values of S 115 and SB 116. In one or more examples, S 115 and SB 116 have the same amplitude Vdda for a logical "1" as is used to drive D 105 and DB 106 with a logical "1". In such examples, this is done so that the glitch energy added by each switch of S and SB is equal to the glitch energy added by the toggling of D and DB when they are switched. In one or more examples S 115 and SB 116 are not switched when D 105 and DB 106 are toggled. When S and SB are switched, their values are thus flipped. For example, a run of the values of S would be {1,0,1,0,1,0} and the corresponding values of SB the inverse, or {0,1, 0, 1, 0, 1}.

As shown in FIG. 2 (and also in FIG. 4, described below), in some examples the shadow switching transistors 107, 108 and 109, 110 may have a width half that of main transistors M1 and M2. This is because there are two pairs of shadow switching transistors, each contributing some glitch energy, at each switch of S and SB. So to make their combined glitch energy equal to that of D and DB, in such examples, they may have a width W/2, as shown.

In one or more embodiments, there is a defined relationship between the toggling of the D 105 and DB 106 signals in the differential amplifier, and the switching of the S and SB signals in each of the bleeder current paths used to respectively generate bleeder currents $I_{Bleed}$ 150A and $I_{Bleed}$ 150B. This is next described with reference to FIG. 3.

Figure 3:
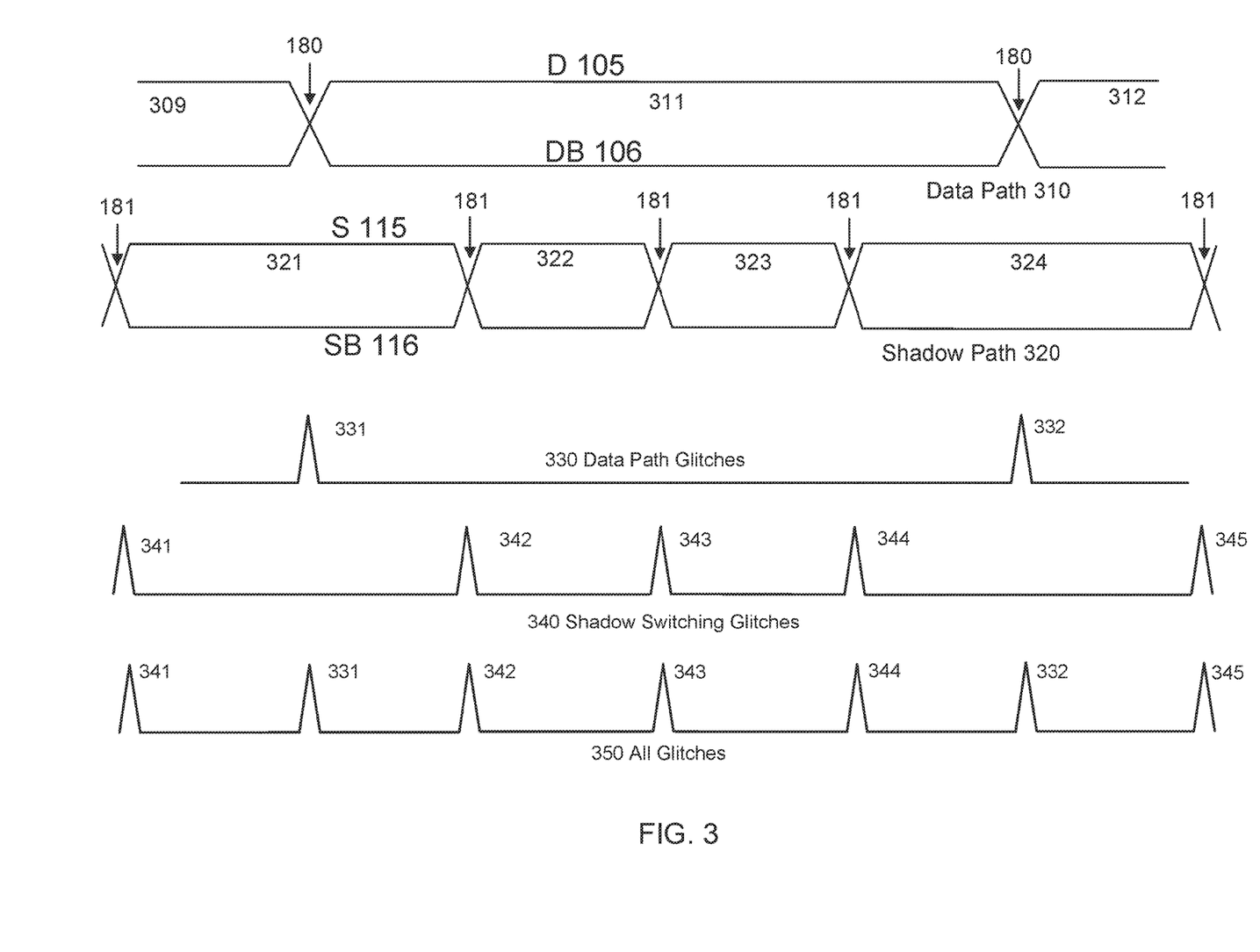
FIG. 3 illustrates the effects of glitch energy added by the shadow switching, according to an example.

FIG. 3 illustrates the effects of glitch energy added by the shadow switching, according to an example. With reference thereto, data path 310 illustrates two partial intervals, and one full interval, between them, of the D and DB signals. As shown, there are two switching points 180, one at the beginning, and the other at the end, of the signal interval. In this example, D 105 is high during the interval, and thus DB 106 is low. The switching points 180 of the data path occur at a regular temporal interval, which is the frequency of the signal being synthesized by the DAC. For example, this synthesized signal frequency, Fout, may be 3.5 GHz, for example. In one or more examples, the shadow switching frequency Fssw of the S and SB signals, in each of the bleeder current paths, may be an integer multiple of the frequency Fout, or Fssw=K*Fout, where K is an integer greater than 2. Or, more generally, for example, the shadow switching frequency may be a linear combination of Fout and the sampling frequency, or clock frequency Fs, used to generate the output signal. What is important is that Fssw operate so as to convert the glitch energy of switching just D and DB, which is thus data dependent, to a regular, and thus data independent, frequency.

However, in one or more examples, there is a further condition on the switching of the S and SB signals. They are not switched whenever the data path signals are switched. Thus, for example, in FIG. 3, shadow path 320 illustrates switching of the shadow transistor signals S 115 and SB 116. Although the shadow path 320 is switched at a frequency Fs that is four times Fout, and thus there would normally be four toggles of shadow path 320 for every one toggle of data path 310, there are only three switches of the shadow path during a given data path bit time interval, as shown. Thus, continuing with reference to FIG. 3, data path 310 switches at the two switching points 180, and shadow path 320 switches at switching points 181. In the general case, for a given shadow switching frequency multiplier K, for each data path bit interval where D and DB toggle, there will be K−1 switching points 181 on the shadow path 320 during the signal interval of the data path, but there will not be a time when a data path switching point 180 coincides with a shadow path switching point 181. This additional "no switching" condition on the shadow path 320 allows glitching energy of the data path 310, e.g., the toggling of signals D and DB, to add to the glitching energy from the shadow path, e.g., the switching of signals S and SB, so that they fit together to make a regular glitching signal at the frequency Fs. Of course if D and DB do not toggle from bit frame to bit frame, then in such data path intervals S 115 and SB 116 do switch. So, for a run of D={1, 1, 1, 1, 1}, where D 105 and DB 106 do not toggle, S and SB thus do switch at Fs.

Continuing still further with reference to FIG. 3, data path glitches line 330 indicates that there is a glitch corresponding to each switching point 180 in data path 310. Thus, there are two glitches shown, namely a glitch 331 at the beginning of the depicted data signal interval 311 and a glitch 332 at the end of the data signal interval 311. Similarly, shadow switching glitches line 340 illustrates a glitch generated by the shadow switching every time that there is a switching point 181 in the shadow path 320. Thus, there is a glitch 341 occurring during the prior data interval 309, there is no glitch generated when the data path switches at 180 from data interval 309 to data interval 310, there are glitches 342, 343, and 344 generated corresponding to the three switching points 181 that occur during (within) the Illustrated data interval 310, again no glitch generated at the final switching point 180 of data path 310, and finally, a final glitch 345 shown at the next transition in shadow path 320, occurring during the next data signal interval 312. Thus, switching signal intervals 321, 324 on the shadow path 320 that straddle transitions 180 in the data path 310 are twice the length of switching signal intervals 322 and 323 of the shadow path 320 that occur during a data pass signal interval, because they are skipping a shadow signal transition at such times.

Continuing still further with reference to FIG. 3, all glitches line 350 illustrates the sum of both the data path glitches 330 and the shadow switching glitches 340. Thus, on the all glitches 350 line there is a glitch at a regular time interval according to the frequency Fs, which is the same frequency as that used for the shadow switching glitches, but where, as noted, a shadow switch is not performed when a data path switching point 181 occurs.

It is noted that in the example circuit of FIG. 2, which does solve the problem of the common mode glitch energy leakage, as described above in detail, there may still be limitations due to mismatch between the cascode devices 107 and 108, and 109 and 110. If such a mismatch is present, then, for example, even when D and DB are static, the current 150A will be slightly different depending upon whether transistor 107 is on, or transistor 108 is on, which is a function of the values of S and SB. $I_{bleed}$ 150A then varies between $I_{bleed}+\Delta$ and $I_{bleed}-\Delta$, for some $\Delta$, at every bit period, so the frequency of that modulation is Fs/2, as it alternates every bit period, so has a full cycle in 2*(bit period). A similar effect will happen at the right side bleeder current path, if there is a mismatch between transistors 109 and 110, except the variation in bleeder current will have a different $\Delta$. Thus, in either case, for the two bleeder current paths, when D and DB are static, and not toggling, this modulation appears at Fs/2. However, if now D and DB are toggling, which is the normal state of affairs, there will be a mixing between this Fs/2 modulation and the toggling frequency of D and DB, Fout. Thus, in that case the mismatches lead to frequency spurs near Fs/2, at Fs/2−Fout, and Fs/2+Fout. These spurs, it is noted, would not be present if the bleeder current paths were not switched as shown in the example of FIG. 2, which causes the modulations at Fs/2 to begin with. To illustrate, suppose for example the Fout (frequency of the synthesized analog signal) is 2.6 GHz, and Fs, the clock signal driving the switching of S and SB is 10 GHz. Fs/2=5 GHz, and Fs/2−Fout=5 GHz−2.6 GHz=2.4 GHz, which is very close to Fout. It is noted that because the other spur, at Fs/2+Fout=7.6 GHz, is far away from the channel at 2.6 GHz, it does not pose a problem, and may be easily filtered out. To address this issue, in alternate examples, a circuit that provides superior spur performance is illustrated in FIG. 4, and is next described.

FIG. 4 is an alternate current steering DAC current cell with added switching in the bleeder current path, here implementing the BSS embodiment, according to an example. The example circuit of FIG. 4 is essentially identical to that of FIG. 2, except for how each additional shadow switching transistor pair is coupled to the bleeder current path. Thus, only the differences between FIG. 4 and FIG. 2 are described.

With reference to FIG. 4, starting at the left side of the circuit, the shadow switching pair of transistors 107 and 108 are connected at both their drains and their sources. Their connected sources are also coupled to node 131, which is between the source of transistor M3 and the drain of bleeder current stack 125 and 127. In FIG. 4, unlike the example of FIG. 2, because the shadow switching pair of transistors, unlike the BGS embodiment, are not in the bleeder current path, the transistors M3 and M4 are once again added, as in the case of the conventional circuit of FIG. 1A. Continuing with reference to FIG. 4, the coupled sources and drains of transistors 107 and 108, here coupled to node 131, do not change the value of bleeder currents 150A and 150B, as these currents are now static, and only follow one path, regardless of the switching of signals S and SB. However, the switching of the S and SB signals applied to the gates of each of transistors 107 and 108, and of 109 and 110, respectively, does generate a glitch each time the signals S and SB are switched. As described above with reference to the example circuit of FIG. 2, the signals S and SB are switched at a clock rate of Fs, except that S and SB are not switched when the data signals D and DB themselves are switched, as described above with reference to FIG. 3A.

Continuing still further with reference to FIG. 4, the glitches generated whenever S and SB are switched are due to changes in capacitive coupling, as next described. In one or more examples, S and SB are switched in a "make before break" manner, which is discussed in detail below with reference to FIG. 8. In one or more examples, switching the S and SB signals in a make or break approach matches the D and DB switching behavior. Further, because the example circuit of FIG. 4 improves HD2 and the signal dependent switching signature of the DAC supply, it also reduces the crosstalk between various DACs on the same supply. This is because the signal dependent switching signature from one DAC, working at one frequency, can feed through supply lines due to finite common mode rejection of the second DAC, and thereby corrupt the output spectrum of the second DAC.

While the example DAC cells illustrated in each of FIGS. 2 and 4 implement the DAC cell in NMOS transistors, other transistor types may be used to implement the circuit, as is known in the art. Thus, for example, if PMOS transistors are used, then the entire circuit would be inverted, with the nodes coupled to ground now coupled to a supply voltage, and the gates of the various transistors driven by voltages less than or equal to 0, as the case may be. Essentially a topology of a PMOS implementation of the circuits shown in FIGS. 2 and 4 would be a 180 degree rotated version of those circuits about an axis normal to, and protruding out of the page.

Figure 5:
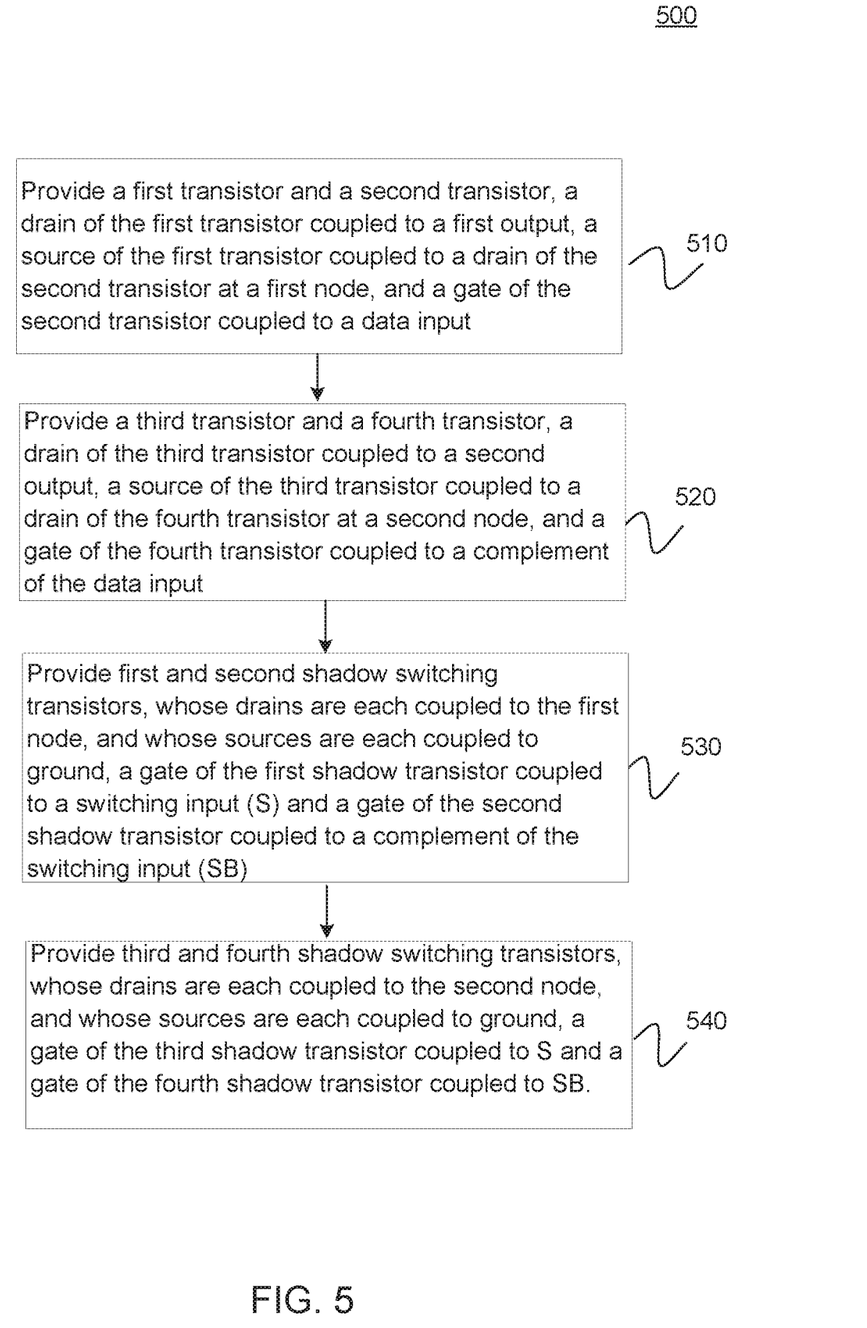
FIG. 5 is a flow diagram of a method for providing a DAC current cell with added shadow switching, according to an example.

FIG. 5 is a flow diagram of a method for providing a DAC current cell with added shadow switching, according to an example. Method 500 includes blocks 510 through 540. In alternate examples method 500 may include greater, or fewer, blocks. Method 500 begins at block 510 where a first transistor and a second transistor are provided, a drain of the first transistor coupled to a first output, a source of the first transistor coupled to a drain of the second transistor at a first node, and a gate of the second transistor coupled to a data input. For example, these may be the left side of the differential amplifier illustrated in FIG. 2, and the first node may be node X.

From block 510, method 500 proceeds to block 520, where a third transistor and a fourth transistor are provided, a drain of the third transistor coupled to a second output, a source of the third transistor coupled to a drain of the fourth transistor at a second node, and a gate of the fourth transistor coupled to a complement of the data input. For example, these may be the right side of the differential amplifier illustrated in FIG. 2, and the second node may be node Y.

From block 520, method 500 proceeds to block 530, where first and second shadow switching transistors are provided, whose drains are each coupled to the first node, and whose sources are each coupled to ground, a gate of the first shadow transistor coupled to a switching input (S) and a gate of the second shadow transistor coupled to a complement of the switching input (SB). For example the first and second shadow transistors may be shadow switching transistors 107 and 108, as shown in FIG. 2, coupled to node X. In some examples the sources of the first and second shadow switching transistors may be coupled to ground via a bleeder current source, such as the stack comprising transistors 125 and 127 as shown in FIG. 2.

From block 530, method 500 proceeds to block 540, where third and fourth shadow switching transistors are provided, whose drains are each coupled to the second node, and whose sources are each coupled to ground, a gate of the third shadow transistor coupled to S and a gate of the fourth shadow transistor coupled to SB. For example the third and fourth shadow switching transistors may be shadow switching transistors 109 and 110, as shown in FIG. 2, coupled to node Y. In some examples the sources of the third and fourth shadow switching transistors may be coupled to ground via a bleeder current source, such as the stack comprising transistors 126 and 128 as shown in FIG. 2.

Method 500 terminates at block 540.

Figure 6:
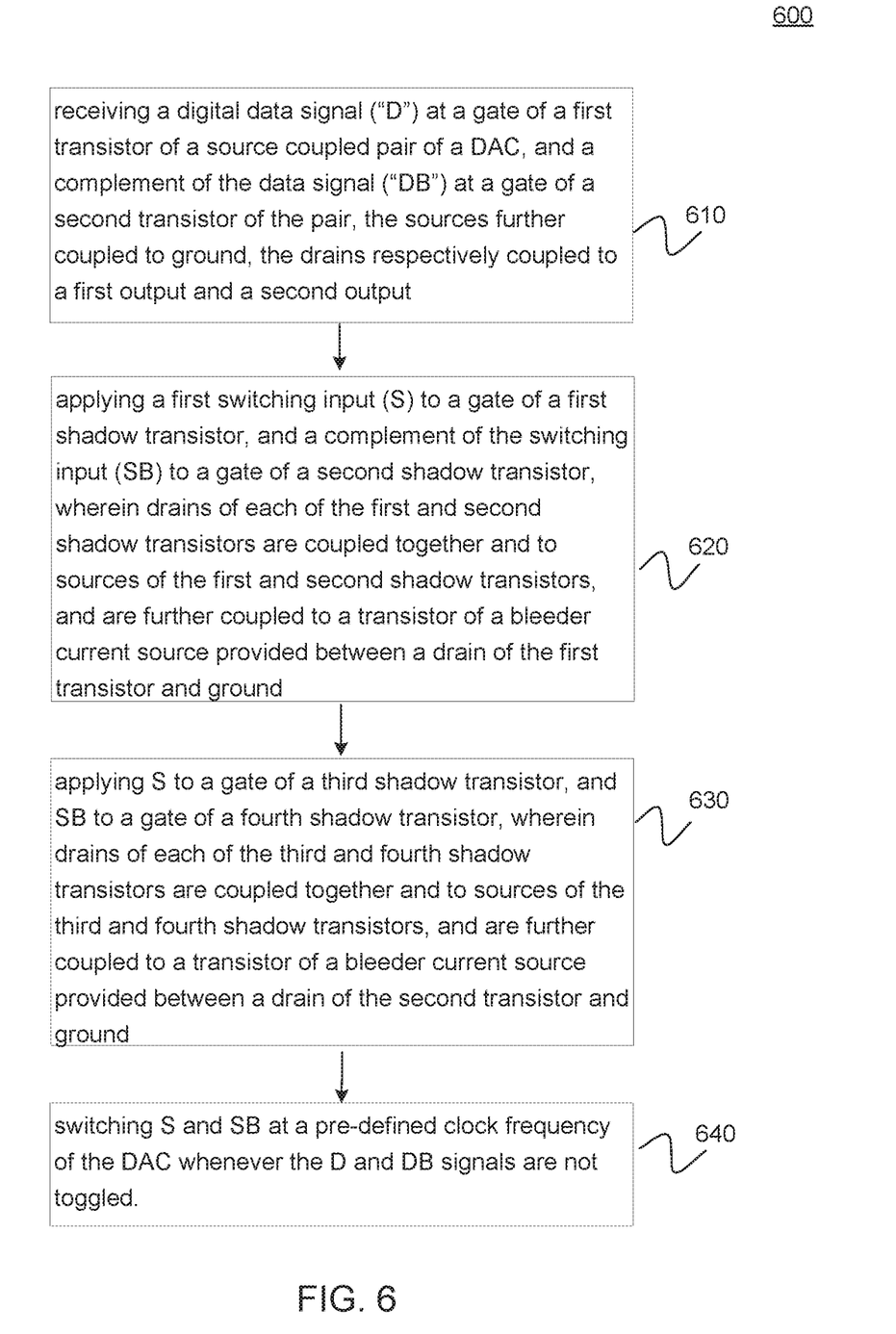
FIG. 6 is a flow diagram of a method of operating a DAC current cell with added shadow switching, according to an example.

FIG. 6 is a flow diagram of a method of operating a DAC current cell with added shadow switching, according to an example. Method 600 includes blocks 610 through 640. In alternate examples method 600 may include greater, or fewer, blocks. Method 600 begins at block 610 where a digital data signal ("D") is received at a gate of a first transistor of a source coupled pair of a DAC, and a complement of the data signal ("DB") at a gate of a second transistor of the pair, the sources further coupled to ground, and the drains respectively coupled to a first output and a second output. For example, the DAC current cell may be cell 400 of FIG. 4, the first and second transistors M1 and M2, the data signal D 105, and its complement DB 106.

From block 610, method 600 proceeds to block 620, where a first switching input (S) is applied to a gate of a first shadow transistor, and a complement of the switching input (SB) is applied to a gate of a second shadow transistor, wherein drains of each of the first and second shadow transistors are coupled together and to sources of the first and second shadow transistors, and are further coupled to a transistor of a bleeder current source provided between a drain of the first transistor and ground. For example, with reference to FIG. 4, the first and second shadow transistors may be transistor pair 107 and 108, and they may be coupled to node 131, which is coupled to the source of M3 and the drain of the first transistor 125 in a bleeder current source stack generating bleeder current 150A.

From block 620, method 600 proceeds to block 630, where S is applied to a gate of a third shadow transistor, and SB is applied to a gate of a fourth shadow transistor, wherein drains of each of the third and fourth shadow transistors are coupled together and to sources of the third and fourth shadow transistors, and are further coupled to a transistor of a bleeder current source provided between a drain of the second transistor and ground. For example, with reference to FIG. 4, the third and fourth shadow transistors may be transistor pair 109 and 110, and they may be coupled to node 133, which is coupled to the source of M4 and the drain of the first transistor 126 in a bleeder current source stack generating bleeder current 150B.

From block 630, method 600 proceeds to block 640, where S and SB are switched at a pre-defined clock frequency of the DAC whenever the D and DB signals are not toggled. For example, the DAC circuit 400 may have logic that takes as inputs D and DB, and switches S and SB at every period of a chosen shadow switching frequency Fssw, whenever D and DB are not toggling. In one or more examples, Fssw is simply the sampling frequency used by the DAC in generating the analog output signal, Fs. Because Fssw is much higher than that of the output signal Fout, S and SB are switched at most intervals. They are only not switched when a switching interval for Fout and Fssw coincide, and also when, at that particular coincident switching interval, D and DB are toggled (as opposed to D staying at its prior interval's value). Method 600 may terminate at block 640.

Thus, according to one or more examples, a data dependent glitch, which may be very hard to filter out, occurring very close to the Fout itself, is converted to a glitch that occurs at the sampling frequency of the DAC, for example. This is done by introducing additional glitch energy at the sampling frequency of the DAC, and thus converting the data glitch energy to a signal component at Fs. Because there is generally other "rubbish" on the output waveform at an Fs component, or at an Fs/2 component, it is relatively easy to deal with such distortions and unwanted spurs. Thus, making removing the common mode leakage energy much easier, in accordance with one or more examples.

In one or more examples, as illustrated, for example in each of FIGS. 2 and 4, what is done is an injection of charge into nodes X and Y, respectively. This charge injection is driven by changes in S/SB, on top of the unavoidable charge caused by toggling of D/DB. The addition of those additional charge injections from the S/SB switching pollutes X and Y with "data independent" charge injections, thus transforming the charge injections from their standard "data dependent" characteristic.

Next described is another alternate DAC current steering circuit, with reference to FIG. 7, that implements the glitch energy cancellation approach.

FIG. 7 depicts an alternate solution to the glitching energy introduced by mismatch, as described above. The alternate solution of the circuit of FIG. 7 uses a different approach than the example circuits illustrated in FIGS. 2 and 4, respectively. In the alternate approach, glitch energy is not augmented, but rather cancelled at the time it is generated by an opposite glitch energy. In one or more examples, this is accomplished by injecting another glitch with an opposite phase into the circuit at each side of the DAC differential amplifier. This is next described.

With reference to FIG. 7, circuit 700 is similar to circuit 100 of FIG. 1A, with an additional "dummy" device added to each side of the DAC. The dummy devices are two common mode (CM) correction devices added to the basic DAC circuit, one on each side, namely CM correction devices 160 and 161. In one or more examples the dummy devices provide capacitances that compensate for the currents injected at nodes X and Y, respectively, by the toggling of the D and DB signals at the gates of transistors M1 and M2, respectively. In the example of FIG. 7, each dummy device 160, 161 is, for example, a transistor whose drain and source are shorted, and whose gate is fed by a "dummy" signal, equal and opposite to the data signal that is applied to the DAC transistors M1 and M2. Thus, for example, as shown in FIG. 7, the data signal D 105, shown in detail at 155, is rising from low to high, and in the same clock interval the DB signal 106, shown in detail at 156, is falling from high to low. However, the two signals D and DB are not symmetric in time. The gate of dummy device 160 is thus driven with the opposite of D signal 155, which is illustrated as Ddummy at 155X. Similarly, the gate of dummy device 161 is thus driven with the opposite of DB signal 156, which is illustrated as DBdummy at 156X. In this example D and DB are toggled in a make before break approach. This is next described with reference to FIG. 8, and is why the two signals are not symmetric with respect to time.

FIG. 8 illustrates the signals D 155 and DB 156 of FIG. 7 on the same time axis, to show how they switch in an asymmetric way. It also shows beneath the plots od D and DB, in dotted lines, their mirror images, Ddummy 155X and DBdummy 156X on the same time axis. With reference thereto, four time points in a switching sequence are shown, namely time points A, B, C and D. Prior to time point A, DB 106 is high, at 1, and D 105 is low, at 0. This is prior to the toggling of these signals in the example of FIG. 7. As noted with reference to FIG. 7, in the depicted example D rises to 1 and DB thus drops to 0. Thus, at time point A, D 105 begins its rise to 1, although DB 106 remains high, and does not yet change. At time point B, DB 106 just begins to drop downwards, while, as shown, D 105 has risen about 20% of the way to its high voltage. Continuing with reference to FIG. 8, at time point C D 105, which started switching first, has already reached its high voltage and is now a logical "1". However, at this same time point C, DB 106 has only fallen about half way down to low. Thus, at time point C, signal D 105 is "made" before signal DB 106 has "broken", which is why this type of switching is known as "make before break." As seen in FIG. 8, the two signals D and DB cross at a time between time points B and C, and when they do, they cross at a voltage Vmin 190 which is approximately ¾ of the way between the low voltage and the high voltage, near the high voltage. Finally, at time point D, DB 106 finally falls all the way to the low voltage. As shown, between time points C and D signal D 105 does not change, as it just remains high. This signal crossover is the same no matter which signal starts out as the high signal, and which starts out as the low signal. Thus, the signal that is rising, rises first, before the other signal falls. Accordingly, if the roles of D and DB in FIG. 8 are reversed, and D 105 started out high, and thus DB 106 started out low, the same signal paths would be used. This insures that at any time one of D or DB will be high or close to it, never dropping below a voltage of Vmin. Referring again to FIG. 7, this insures that one of transistors M1 and M2 will always be on, which insures, in turn, that the voltage at the "Y" node of the DAC, or node Z, does not ever drop too low, which would then cause the current $I_{main}$ 151, which is generated in the constant current source comprising transistors 195 and 196, to not be constant.

The plots of Ddummy 155X and DBdummy 156X do exactly the inverse of their respective base signals, D 155 and DB 156, and thus Ddummy 155X begins to go low prior to DBdummy beginning to go high. Thus, Ddummy and DBdummy cross each other at the same point in time that D and DB cross each other, but this time the dummy signals cross at a point Vmin 190X, which is closer to the voltage used for a digital "0" by the same fraction of the voltage range by which Vmin 190 is closer to a digital "1", as shown, which is, in this example, about ¾ of the voltage range.

In one or more examples, to generate D and DB in this make before break manner, one may, for example, pass each signal through two inverters that have different rise and fall times, for example, such as NMOS and PMOS devices. For example, one signal may pass through a weak NMOS inverter in series with a strong PMOS inverter, and the other may pass through the reverse, a weak PMOS inverter in series with a strong NMOS inverter. Similarly, to generate the dummy signals Ddummy and DBdummy, one passes the same original signal D or DB, through two inverters with the strong and weak characteristics of the two transistor types being the opposite of those used for the inverters used to generate the D and DB signals, respectively.

Thus, for Ddummy 155X one may not just use DB 156, and for DBdummy one may not just use D. While logically DB is the inverse of D, and thus D the inverse of DB, however in time they are not inverses, and not mirror images of each other, as shown in FIG. 8. However, Ddummy must be generated to be a mirror image about a horizontal line provided in the two dimensional space of FIG. 8, for example, of D and DBdummy must be generated to be a mirror image about that same horizontal line. It is only by generating Ddummy 155X, does one obtain a signal with the opposite voltage over time, as it has the exact same slope value but of the opposite sign. For example, as D 105 rises from low to high with the slope and initial rise time of point A as shown in FIG. 8, Ddummy falls from high to low with the same slope but opposite sign, with the same initial fall time of point A. And, similarly, as DB falls from high to low, with the slope as shown in FIG. 8, and the same initial fall time of point B, DBdummy rises from low to high with the same slope but opposite sign, starting its rise at the same initial time of point B.

In one or more examples, circuit 700 may also include logic (not shown in FIG. 7) to receive the signals 155 and 156, and generate their inverses 155X and 156X. Such circuits are known to those skilled in the art, and include, for example, appropriately selected inverters.

Returning now to FIG. 7, the dummy signals 155X and 156X may be generated to provide the exact opposite voltage at any time that is provided on their adjacent transistor M1 or M2. This injects charge at nodes X and Y in an asymmetric way, and balances exactly the charge injections of data signals D 105 and DB 106, respectively, on each side of the differential amplifier, which themselves are asymmetric in time as just described. This has the effect of balancing the glitches generated by signals D and DB, respectively. Thus, the addition of dummy structures 160 and 161, which, in one or more examples, are controlled by dedicated signals Ddummy 155X and DBdummy 156X (generated off of the real DAC signals D and DB), reduces the charge injection caused by the DAC data signals toggling. In one or more examples, the size of the dummy devices affects the compensation effect that they provide. Thus, in one or more examples, if using transistors for the two dummy devices, they may have approximately the same size as M1 and M2, but somewhat less, so as to provide an equal capacitance to M1 and M2, respectively.

As an additional benefit, it is noted that the dummy devices 160, 161 of FIG. 7, in addition to reducing the $2^{nd}$ harmonic spurs in a DAC circuit by cancelling the glitch energy, also provide the positive side effect of reduction of the 3rd harmonic, and an increase of bandwidth, due to the DAC now having a reduction of the undesired glitchy behavior on very important internal nodes.

FIG. 9 illustrates the effects of glitch energy added by the compensation capacitance supply devices, e.g., the dummy devices of FIG. 7, according to an example. With reference thereto, FIG. 9 illustrates the effects of glitch energy added by the shadow switching, and canceled by the compensation signals according to an example. FIG. 9 uses the same rubric as was used in FIG. 3, but with the different signals of FIG. 7. With reference thereto, data path line 310 illustrates two partial intervals, and one full interval, between them, of the D and DB signals. As shown, there are two switching points 180, one at the beginning, and the other at the end, of the data signal interval. In this example, D 105 is high during the interval, and thus DB 106 is low. The switching points 180 of the data path occur at a regular temporal frequency, which is the frequency of the signal being synthesized by the DAC. For example, this synthesized signal frequency, Fout, may be 3.5 GHz, for example.

Continuing with reference to FIG. 9, compensation signal path 912 illustrates the dummy signals Ddummy 155X and DBdummy 156X, which are the respective inverses of D and DB, both in logical value (voltage) and in time, as described above. Data path glitches line 330 thus shows the data path glitches 331 and 332, as described above with reference to FIG. 3. Here in FIG. 9, there is also shown, on compensation glitches line 940, the compensation glitch energy generated by the Ddummy 155X and DBdummy 156X signals, as glitches 331C and 332C, and these latter glitches are equal in magnitude, but exactly opposite in sign, to data path glitches 331 and 332, respectively. Thus, the glitch energy of compensation glitches line 940, when added to that of data path glitches line 330, sums to zero, as shown on all glitches line 950, which is the sum of all of the glitches in the circuit's output, which is zero in the ideal (assuming the capacitance of each dummy device 160, 161 perfectly balances its corresponding transistor M1, M2, respectively).

Thus, in one or more examples, various circuits have been described that may be used to improve HD2 and cross-talk performance of RF DACs. In one or more examples undesired glitch energy introduced by charge injections created when the D and DB signals toggle in a DAC may be either canceled or augmented. If canceled, the effect of the undesired charge injections at respective nodes coupled to each output of the DAC is compensated for by introducing an opposite charge injection at each such node. This approach is illustrated in the example of FIGS. 7-9, described above. On the other hand, if the glitch energy is to be augmented, then additional glitch energy is introduced to the outputs of the circuit, at a period that facilitates its easily being filtered out. This approach is illustrated in FIGS. 2-6, and described in detail above.

While the foregoing is directed to embodiments of the present invention, other and further embodiments of the invention may be devised without departing from the basic scope thereof, and the scope thereof is determined by the claims that follow.

What is claimed is:

1. A digital to analog converter (DAC) current steering circuit, comprising:
    first and second transistors, a drain of the first transistor coupled to a first output, a source of the first transistor coupled to a drain of the second transistor at a first node, and a gate of the second transistor coupled to a data input (D);
    third and fourth transistors, a drain of the third transistor coupled to a second output, a source of the third transistor coupled to a drain of the fourth transistor at a second node, and a gate of the fourth transistor coupled to a complement of the data input (DB); and
    first and second shadow transistors, whose drains are each coupled to the first node, and whose sources are each coupled to ground, a gate of the first shadow transistor coupled to a switching input (S) and a gate of the second shadow transistor coupled to a complement of the switching input (SB); and
    third and fourth shadow transistors, whose drains are each coupled to the second node, and whose sources are each coupled to ground, a gate of the third shadow transistor coupled to S and a gate of the fourth shadow transistor coupled to SB.

2. The circuit of claim 1, further comprising a first bleed current source coupled between the sources of the first and second shadow transistors and ground, and a second bleed current source coupled between the sources of the third and fourth shadow transistors and ground.

3. The circuit of claim 2, wherein each of the first and second bleed current sources includes a stack of at least one transistor.

4. The circuit of claim 1, wherein the sources of the second and fourth transistors are connected at a third node, the third node coupled to ground via a main current source.

5. The circuit of claim 4, wherein the main current source includes a stack of one or more transistors, each of whose gates are supplied with a pre-defined voltage signal.

6. The circuit of claim 1, wherein the S and SB switching signals are switched at a pre-defined rate, but not switched when the D and DB signals are toggled.

7. The circuit of claim 1, wherein, when switched, the S and SB signals are switched in a make before break manner.

8. A digital to analog converter (DAC) current steering circuit, comprising:
    a first transistor, a drain of the first transistor coupled to a first output node, a source of the first transistor coupled to a common node, and a gate of the first transistor coupled to a data input;
    a second transistor, a drain of the second transistor coupled to a second output node, a source of the second transistor coupled to the common node, and a gate of the second transistor coupled to a complement of the data input;
    a third transistor whose drain is coupled to a drain of the first transistor, and whose source is coupled to ground;
    a fourth transistor whose drain is coupled to a drain of the second transistor, and whose source is coupled to ground;
    first and second shadow transistors, whose drains and sources are each coupled to the source of the third transistor, a gate of the first shadow transistor coupled to a switching input (S) and a gate of the second shadow transistor coupled to a complement of the switching input (SB); and
    third and fourth shadow transistors, whose drains and sources are each coupled to the source of the fourth transistor, a gate of the third shadow transistor coupled to S and a gate of the fourth shadow transistor coupled to SB.

9. The circuit of claim 8, wherein the source of the third transistor is coupled to ground through a first bleed current source, and the source of the fourth transistor is coupled to ground through a second bleed current source.

10. The circuit of claim 8, wherein the sources of the first and second transistors are connected at a third node, the third node coupled to ground via a main current source.

11. The circuit of claim 8, wherein the first and second transistors have a same first width, wherein the first, second third and fourth shadow transistors have a same second width, and wherein the second width is less than the first width.

12. The circuit of claim 11, wherein the second width is one-half of the first width.

13. The circuit of claim 8, wherein the S and SB switching signals are switched at a pre-defined rate, but not switched when the D and DB signals are toggled.

14. The circuit of claim 13, wherein, when switched, the S and SB signals are switched in a make before break manner.

15. The circuit of claim 8, further comprising a first upper transistor and a second upper transistor, a source of the first upper transistor coupled to the first output node and a drain of the first upper transistor coupled to the source of the first transistor, and a source of the second upper transistor coupled to the second output node and a drain of the second upper transistor coupled to the source of the second transistor.

16. A DAC current steering circuit, comprising:
    a first transistor, a drain of the first transistor coupled to a first output, a source of the first transistor coupled to a drain of a second transistor at a first node, and a gate of the second transistor coupled to a data input signal;
    third and fourth transistors, a drain of the third transistor coupled to a second output, a source of the third transistor coupled to a drain of the fourth transistor at a second node, and a gate of the fourth transistor coupled to a complement of the data input signal, the sources of each of the third and fourth transistors connected at a third node, the third node coupled to a main current source; and
    first and second compensation capacitance supplies respectively coupled to the first and second nodes, the first compensation capacitance supply controlled by an inverse of the data input signal, and the second compensation capacitance supply controlled by an inverse of the data input complement signal.

17. The circuit of claim 16, wherein the first and second compensation capacitance supplies are first and second metal-oxide-semiconductor (MOS) transistors, each of whose drains and sources are connected, the gate of the first transistor driven by the inverse of the data input signal, and the gate of the second transistor driven by the inverse of the data input complement signal.

18. The circuit of claim 16, further comprising a first bleed current source coupled between the first node and ground, and a second bleed current source coupled between the second node and ground.

19. The circuit of claim 16, wherein the data input and data input complement signals are switched in an asymmetric manner.

20. The circuit of claim 16, further comprising logic configured to:
  receive the data input and data input complement signals; and
  generate the inverse of the data input signal and the inverse of the data input complement signal.

* * * * *